United States Patent [19]
Creedon et al.

[11] Patent Number: 5,185,537
[45] Date of Patent: Feb. 9, 1993

[54] GATE EFFICIENT DIGITAL GLITCH FILTER FOR MULTIPLE INPUT APPLICATIONS

[75] Inventors: Tadhg Creedon; Eugene G. O'Neill, both of Galway; Jerome A. Nolan, Newcastle West, all of Ireland

[73] Assignee: Digital Equipment Corporation, Maynard, Mass.

[21] Appl. No.: 828,244

[22] Filed: Jan. 30, 1992

[51] Int. Cl.⁵ .................... H03K 5/22; H03K 5/00
[52] U.S. Cl. .................. 307/234; 307/542.1; 328/167
[58] Field of Search ............ 307/234, 542.1, 443, 307/520, 521; 328/111, 165, 167

[56] References Cited
U.S. PATENT DOCUMENTS

| | | | |
|---|---|---|---|
| 3,800,125 | 3/1974 | Cleary, Jr. | 377/43 |
| 3,989,960 | 11/1976 | Kodama | 307/542.1 |
| 4,353,032 | 10/1982 | Taylor | 328/165 |
| 4,417,155 | 11/1983 | Aizawa | 307/542.1 |
| 5,053,651 | 10/1991 | Frerking et al. | 328/111 |

Primary Examiner—Janice A. Howell
Assistant Examiner—Sinh N. Tran
Attorney, Agent, or Firm—Kenyon & Kenyon

[57] ABSTRACT

A digital glitch filter includes first and second NOR gates coupled with feedback to form a first sampling stage, third and fourth NOR gates coupled to the output of the first and second NOR gate, respectively, and fifth and sixth NOR gates coupled with feedback to form a second sampling stage and coupled to the output of the third and fourth NOR gate, respectively, as well as three AND gates. A clock pulse generator is used to generate the pulse signals required by the glitch filter. For multiple-signal applications, the glitch filter requires relatively few gates.

10 Claims, 6 Drawing Sheets

GATE EFFICIENT DIGITAL GLITCH FILTER FOR MULTIPLE INPUT APPLICATIONS

FIELD OF THE INVENTION

The present invention relates to a glitch filter and in particular to a digital glitch filter including two stages of sampling.

BACKGROUND OF THE INVENTION

A glitch filter is used in computer systems to sample an electrical signal (i.e., the input signal to the filter) and output the glitch-free state of the signal. In particular, a glitch filter allows a sampled signal to change its state (e.g., from a LOW state to a HIGH state, or from a HIGH state to a LOW state) only after it exhibits this change in state for a certain period of time. A glitch filter may be implemented using either analog or digital circuitry. The present invention relates to the latter.

Typically, a digital glitch filter includes two stages of sampling and a comparison between the two stages. Each stage of sampling may be implemented by using a flip-flop, and the comparison may be implemented by using logic gates. The output signal of the glitch filter may change only if the input signal remains in the changed state for two consecutive system clock pulses.

Nineteen gates are required to implement such a glitch filter in TSB140G, a 1.0 μm cmos technology. When a large number of signals are to be filtered, the nineteen gates required per filter may lead to large total space requirements as required by the larger die area of the prior art design and high costs.

SUMMARY OF THE INVENTION

The present invention provides a glitch filter which requires far fewer gates than previously known glitch filters for certain multiple-signal applications. Generally, the present invention comprises an arrangement of logic gates, such as, e.g., AND and NOR gates, coupled to one another in a manner to reduce the total number of gates required to provide a glitch filter. The NOR gates are arranged in coupled sets with feedback to provide sampling stages. The sampling stages are used to sample and compare a state of an input signal to a subsequent state of the input signal to make certain that the input signal stays in a particular state for a preselected period of time. The feedback couplings are used to control the passage of signals through the coupling stages to provide proper comparisons within the preselected period of time.

In one exemplary embodiment, the glitch filter according to the present invention includes a first AND gate for receiving a signal to be filtered and a second pulse signal, a first NOR gate having a first input coupled to an output of the first AND gate, and a second NOR gate having a first input coupled to an output of the first NOR gate, a second input for receiving a third pulse signal, and an output coupled to a second input of the first NOR gate. As a result, feedback is provided between the first NOR gate and second NOR gate.

The glitch filter also includes a third NOR gate having a first input coupled to the output of the first NOR gate, and a fourth NOR gate having a first input for receiving the signal to be filtered and a second input coupled to the output of the second NOR gate.

In addition, the glitch filter includes a second AND gate having a first input for receiving the signal to be filtered and a second input coupled to an output of the third NOR gate, and a fifth NOR gate having a first input coupled to an output of the second AND gate, as well as a third AND gate having a first input coupled to an output of the fourth NOR gate and a second input for receiving a first pulse signal, the third NOR gate having a second input for receiving an inverted first pulse signal. The glitch filter further includes a sixth NOR gate having a first input coupled an output of the third AND gate, a second input coupled to an output of the fifth NOR gate, and an output coupled to a second input of the fifth NOR gate, the output of the sixth NOR gate being a filtered output signal of the glitch filter. Therefore, feedback is also provided between the fifth NOR gate and the sixth NOR gate.

Thus, the glitch filter is implemented, for example, in only nine gates as compared to the nineteen gates required by the above-described known glitch filter when using TSB140G technology.

A clock pulse generator according to the present invention is used to generate the various pulse signals required by the glitch filter of the present invention. Each of the pulse signals is in a HIGH state for a portion of the period of the pulse signal.

However, one clock pulse generator can be used for multiple glitch filters included in a computer system. Moreover, each glitch filter of the present invention requires fewer gates than a glitch filter of the prior art. Consequently, for multiple-signal applications, an arrangement of glitch filters according to the present invention requires far fewer total gates than would a glitch filter arrangement according to the prior art. As a result, the glitch filter of the present invention will result in smaller space requirements and lower costs for a computer system where multiple signals must be filtered.

DETAILED DESCRIPTION

Figure 1:
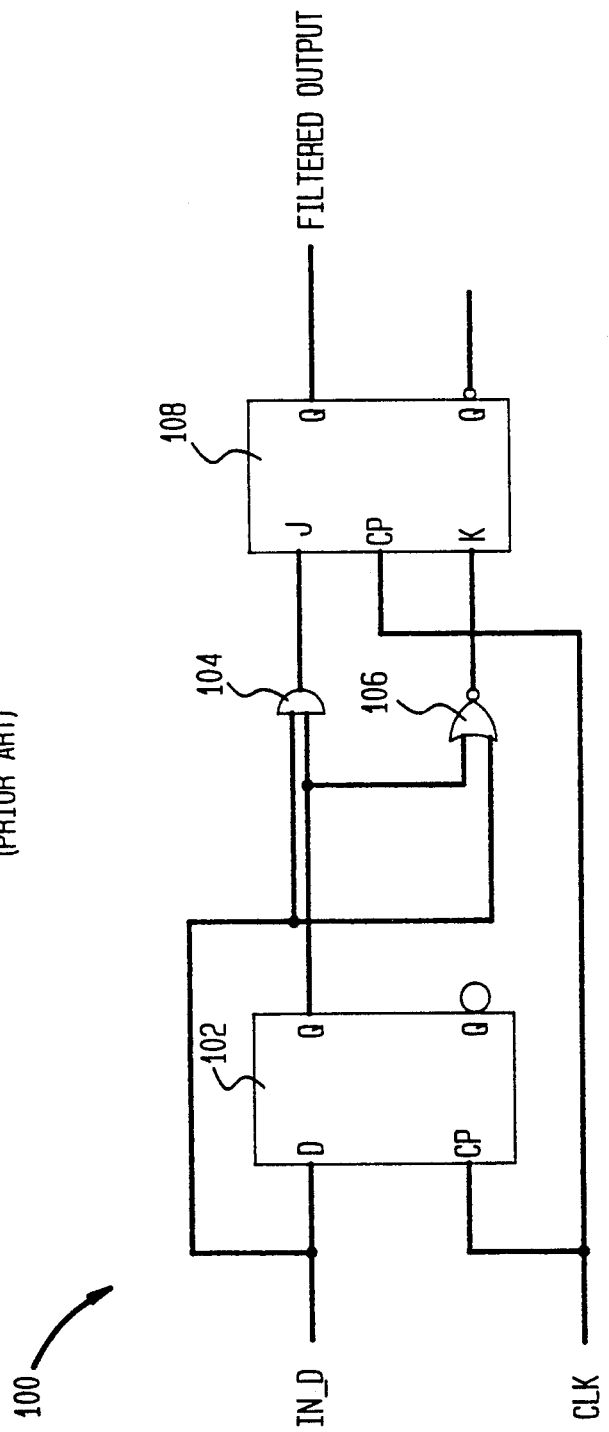
FIG. 1 shows a circuit diagram of a glitch filter of the prior art.

Referring to FIG. 1, there is shown a circuit diagram of a digital glitch filter 100 of the prior art. An input signal $IN_{13}D$ to be filtered is applied to the D input of a D flip-flop 102, as well as to a first input of an AND gate 104 and to a first input of a NOR gate 106. The Q output of the D flip-flop 102 is coupled to a second input of the AND gate 104 and to a second input of the NOR gate 106.

The output of the AND gate 104 is coupled to the J input of a J-K flip-flop 108. The output of the NOR gate 106 is connected to the K input of the J-K flip-flop 108.

The Q output of the J-K flip-flop 108 is the filtered output signal of the glitch filter 100.

A computer system clock CLK is applied to a clock input of each of the flip-flops 102, 108. Because the glitch filter 100 includes two stages of sampling 102, 108, as well as a comparison between the two stages 104, 106, the output signal of the glitch filter 100 changes only if the input signal $IN_{13}D$ remains in the changed state for two consecutive system clock CLK pulses.

The input signal $IN_{13}D$ to be filtered is initially sampled by the D flip-flop 102 upon the occurrence of a system clock CLK pulse. The Q output of the D flip-flop 102 is then used to sensitize the input signal $IN_{13}D$ through to either the J or K input of the J-K flip-flop 108 for the next system clock CLK pulse.

More specifically, if the input signal $IN_{13}D$ is initially in a LOW state upon the occurrence of a first system clock CLK pulse, the path through the NOR gate 106 to the K input of the J-K flip-flop 108 would be sensitized. If the input signal $IN_{13}D$ is still in a LOW state at the next (second) system clock CLK pulse, the signal at the K input of the J-K flip-flop 108 will be at a HIGH state, causing the filtered output of the J-K flip-flop 108 to go to a LOW state, i.e., the same state as the state of the input signal $IN_{13}D$. If, however, the input signal $IN_{13}D$ goes to a HIGH state by the second system clock CLK pulse, i.e., a glitch occurs, the signal at the K input of the J-K flip-flop 108 will have returned to a LOW state, and therefore the filtered output of the J-K flip-flop 108 would remain unchanged.

On the other hand, if the input signal IN—D is initially in a HIGH state upon the occurrence of a first system clock CLK pulse, the path through the AND gate 104 to the J input of the J-K flip-flop 108 would be sensitized. If the input signal $IN_{13}D$ is still in a HIGH state at the second system clock CLK pulse, the signal at the J input of the J-K flip-flop 108 will be at a HIGH state, causing the filtered output of the J-K flip-flop 108 to go to a HIGH state, i.e., the same state as the state of the input signal $IN_{13}D$. If, however, the input signal $IN_{13}D$ goes to a LOW state by the second system clock CLK pulse, i.e., a glitch occurs, the signal at the J input of the J-K flip-flop 108 will have returned to a LOW state, and therefore the filtered output of the J-K flip-flop 108 would remain unchanged.

The above-described glitch filter, while effective, requires nineteen gates to implement. As described above, the total gate count becomes expensive when a relatively large number of signals must be filtered.

A glitch filter according to the present invention, as will be described below with reference to FIGS. 4-6, requires several sampling pulses as inputs to the filter. These pulses are supplied by a clock pulse generator according to the present invention. The clock pulse generator will therefore be described first, referring to the circuit diagram of FIG. 2.

The clock pulse generator 200 includes first through sixth D flip-flops 201-206, respectively. A computer system clock $CLK_{13}H$ is applied to a clock input of each of the second, fourth, and sixth D flip-flops 202, 204, 206, respectively. Clock $CLK_{13}H$ is an active-high signal (i.e., active at state 1), as denoted by the "H" at the end of its name. A computer system clock $CLK_{13}L$ is applied to a clock input of each of the first, third, and fifth D flip-flops 201, 203, 205, respectively. Clock $CLK_{13}L$ is clock $CLK_{13}H$ inverted (as indicated by its same basic name), and is thus an active-low signal (i.e., active at state 0), as denoted by the "L" at the end of its name. Hereinafter, active-high and active-low signals will be named in accordance with this naming scheme.

A system clear signal $PCLR_{13}L$ is applied to a clear input of each of the first, third, and fifth D flip-flops 201, 203, 205, respectively. Another system clear signal $NCLR_{13}L$ is applied to a clear input of each of the second, fourth, and sixth D flop-flops 202, 204, 206, respectively. These signals $PCLR_{13}L$, $NCLR_{13}L$ are used to control the resetting of the D flop-flops 201-206.

A sampling clock signal $PICLK_{13}H$ is applied to the D input of the first D flip-flop 201. A delay clock signal $D1PICLK_{13}H$ at the Q output of the first D flip-flop 201 is applied to the D input of the second D flip-flop 202. Similarly, a delay clock signal $D2PICLK_{13}H$ at the Q output of the second D flip-flop 202 is applied to the D input of the third D flip-flop 203, and so forth. A delay clock signal $D6PICLK_{13}H$ is the signal at the Q output of the sixth D flip-flop 206.

The sampling clock signal $PICLK_{13}H$ is also applied to a first input of a NAND gate 211. A second input of the NAND gate 211 is coupled to the inverting-Q output of the second D flip-flop 202. The output of the NAND gate 211 is coupled to the input of an inventor 212. The output of the invertor 212 is a sampling pulse $APULSE_{13}H$ for the glitch filter according to the present invention. The sampling pulse $APULSE_{13}H$ is applied to another invertor to form an inverted sampling pulse $APULSE_{13}L$.

A delay clock signal $D4PICLK_{13}H$ at the Q output of the fourth D flip-flop 204 is applied to a first input of a NAND gate 221. A delay clock signal $D6PICLK_{13}L$ at the inverting-Q output of the sixth D flip-flop 206 is applied to a second input of the NAND gate 221. The output of the NAND gate 221 is applied to an invertor 222 to form a sampling pulse $BPULSE_{13}H$.

A delay clock signal $D3PICLK_{13}H$ at the Q output of the third D flip-flop 203 is applied to a first input of a NAND gate 231. A delay clock signal $D4PICLK_{13}L$ at the inverting-Q output of the fourth D flip-flop 204 is applied to a second input of the NAND gate 231. The output of the NAND gate 231 is applied to an invertor 232 to form a sampling pulse $CPULSE_{13}H$.

Figure 2:
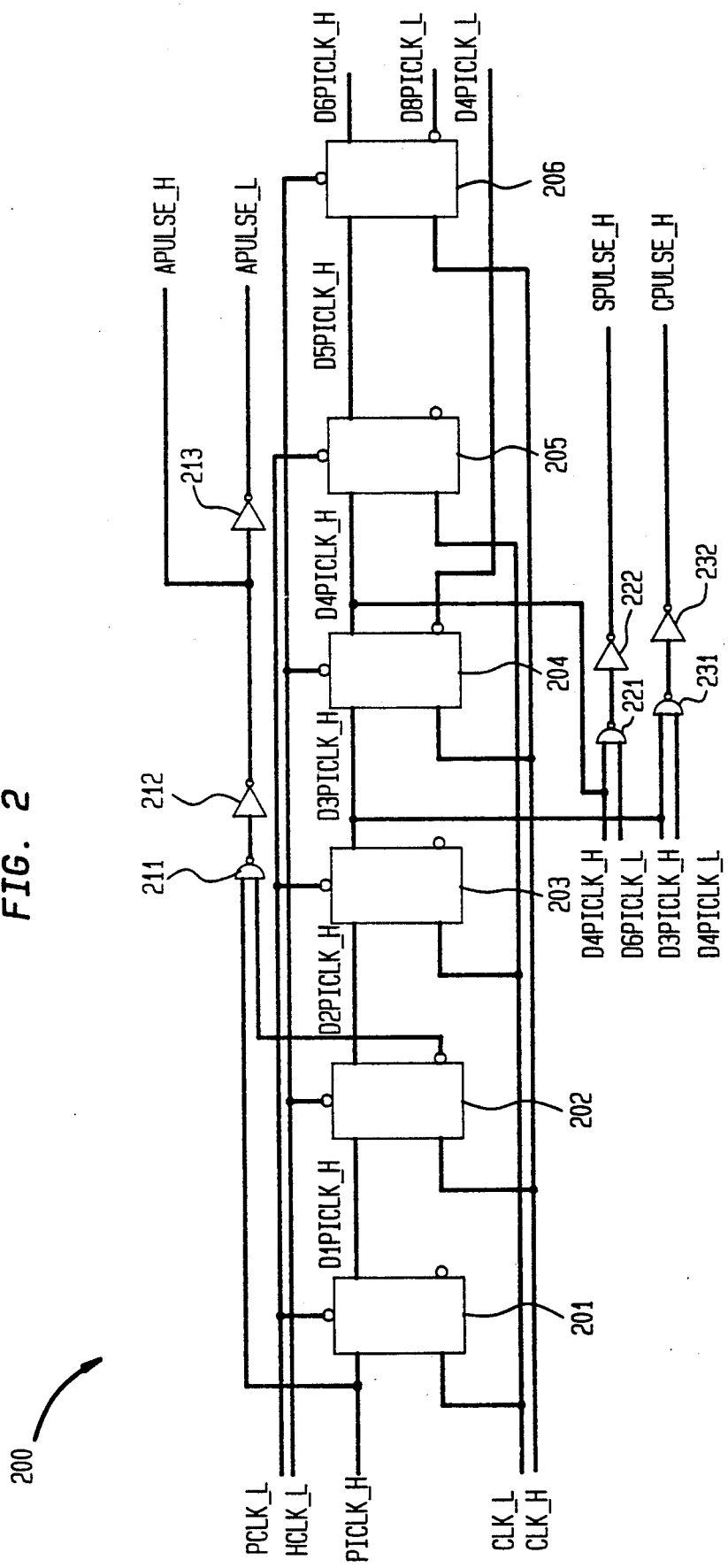
FIG. 2 shows a circuit diagram of a clock pulse generator for a glitch filter according to the present invention.
Figure 3:
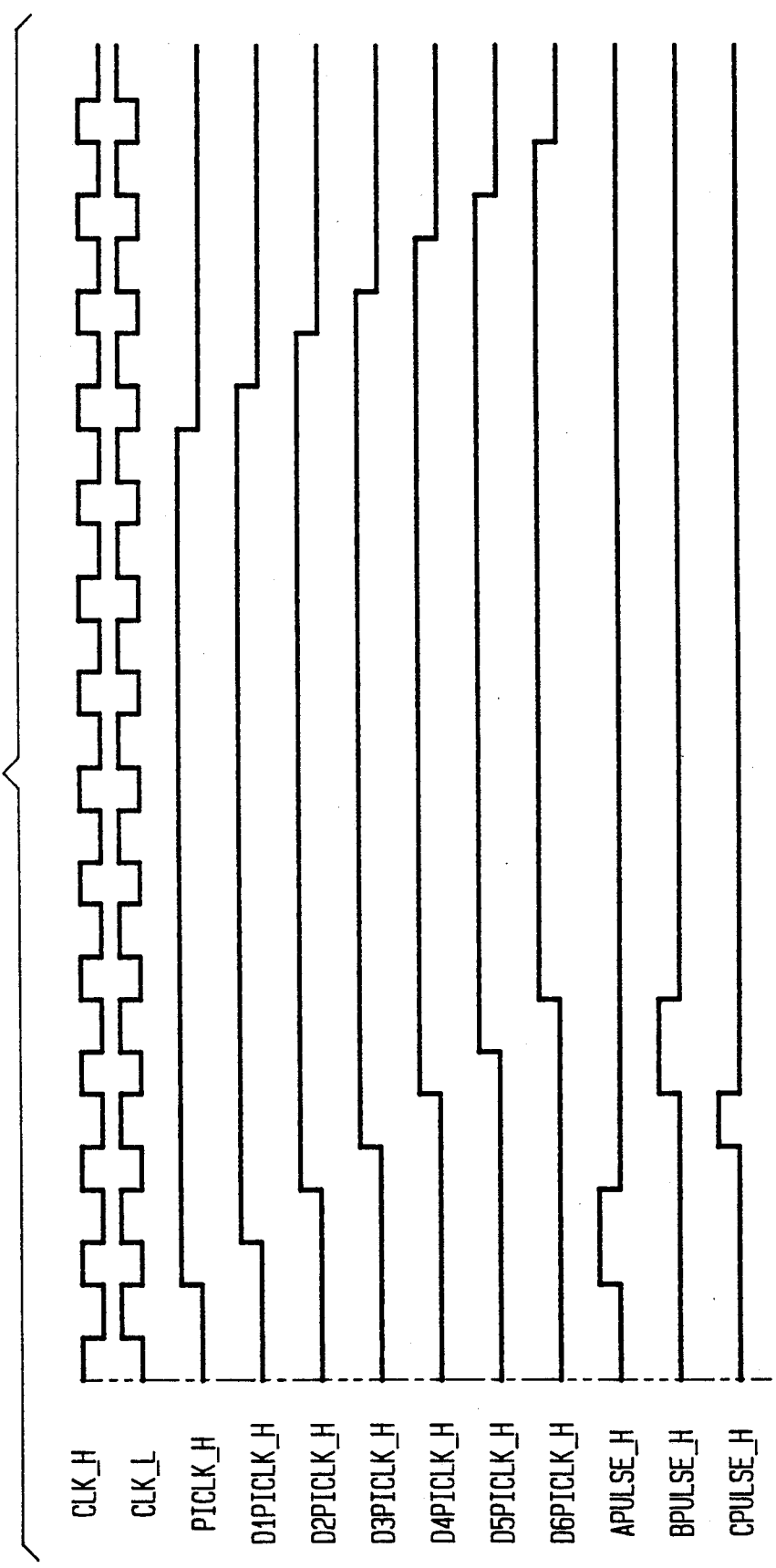
FIG. 3 shows a timing diagram for the clock pulse generator of FIG. 2.

Referring now to FIG. 3, there is shown a timing diagram for the clock pulse generator 200 of FIG. 2. The period of the sampling clock signal $PICLK_{13}H$ is equal to a predetermined number of periods of the system clock $CLK_{13}H$. The period of the sampling clock signal $PICLK_{13}H$ is related to the frequency of sampling of an input signal, as will be further explained. The sampling clock signal $PICLK_{13}H$ can be derived from the system clock $CLK_{13}H$ through the use of a logic circuit (e.g., a programmable register—not shown), as would be clearly understood by those skilled in the art.

The delay clock signals $D1PICLK_{13}H$ through $D6PICLK_{13}H$ are simply the sampling clock signal $PICLK_{13}H$ delayed by a number of transitions of the system clock $CLK_{13}H$ pulses, either from a LOW state to a HIGH state or vice versa, that is, by a number of half pulses of the system clock corresponding to the number of the respective D flip-flop. In other words, the delay clock signal $D1PICLK_{13}H$ is the sampling clock signal $PICLK_{13}H$ delayed by one half pulse of the system clock $CLK_{13}H$, the delay clock signal $D2PICLK_{13}H$ is the sampling clock signal $PICLK_{13}H$ delayed by one full pulse of the system clock $CLK_{13}H$, and so forth, as shown in FIG. 3.

The sampling pulse APULSE$_{13}$H switches to a HIGH state at approximately the same time as the sampling clock signal PICLK$_{13}$H switches to a HIGH state. The sampling pulse CPULSE$_{13}$H switches to a HIGH state at approximately the same time as the delay clock signal D3PICLK$_{13}$H. The sampling pulse BPULSE$_{13}$H switches to a HIGH state at approximately the same time as the delay clock signal D4PICLK$_{13}$H. As shown in FIG. 3, generally, at most one of the sampling pulses APULSE$_{13}$H, BPULSE$_{13}$H, CPULSE$_{13}$H is at a HIGH state at any given time. There is potentially some overlap between the end of the CPULSE$_{13}$H and the start of the BPULSE$_{13}$H due to propagation delays. However, this is not a problem in that BPULSE$_{13}$H overrides CPULSE$_{13}$H in the first cross-coupled set of NOR gates 401–403.

Figure 4:
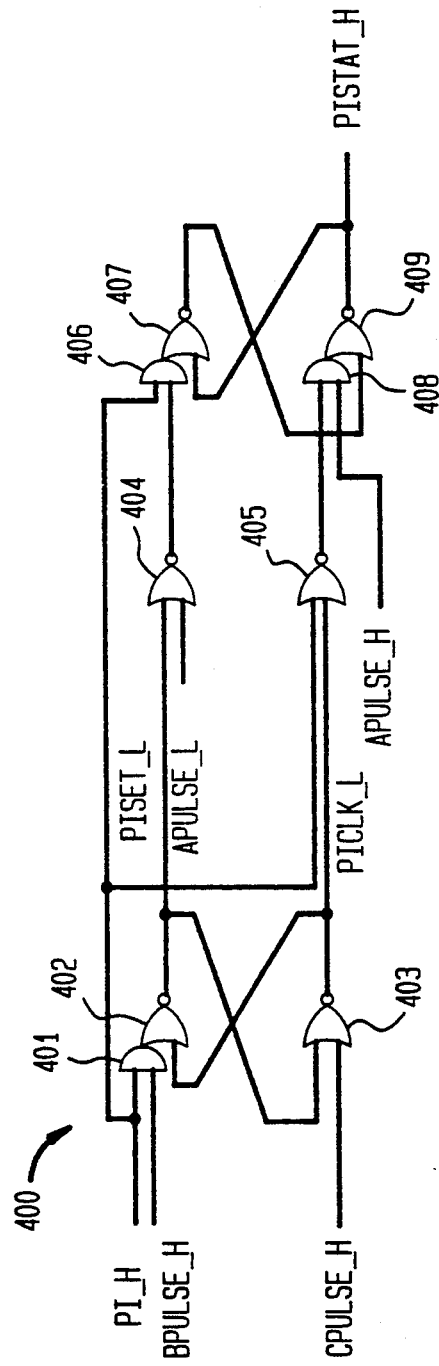
FIG. 4 shows a glitch filter according to the present invention.

Referring now to FIG. 4, there is shown a circuit diagram of a glitch filter 400 according to the present invention. The glitch filter 400 uses the sampling pulses APULSE$_{13}$H, APULSE$_{13}$L, BPULSE$_{13}$H, CPULSE$_{13}$H generated by the clock pulse generator 200 of FIG. 2 described above.

An input signal PI$_{13}$H to be filtered is applied to a first input of an AND gate 401. The sampling pulse BPULSE$_{13}$H is applied to a second input of the AND gate 401. The output of the AND gate 401 is coupled to a first input of a NOR gate 402. The output signal PISET$_{13}$L from the NOR gate 402 is applied to a first input of a NOR gate 403. The sampling pulse CPULSE$_{13}$H is applied to the second input of the NOR gate 403. The output signal PICLR$_{13}$L from the NOR gate 403 is applied to a second input of the NOR gate 402.

The signal PISET$_{13}$L is further applied to a first input of a NOR gate 404. The sampling pulse APULSE$_{13}$L is applied to a second input of the NOR gate 404. The signal PICLR$_{13}$L is also further applied to a first input of a NOR gate 405. The input signal PI H to be filtered is applied to the second input of the NOR gate 405.

The input signal to be filtered PI$_{13}$H is also applied to a first input of an AND gate 406. The output of the NOR gate 404 is coupled to a second input of the AND gate 406. The output of the AND gate 406 is coupled to a first input of a NOR gate 407.

The output of the NOR gate 405 is coupled to a first input of an AND gate 408. The sampling pulse APULSE$_{13}$H is applied to a second input of the AND gate 408. The output of the AND gate 408 is coupled to a first input of a NOR gate 409. The output of the NOR gate 407 is coupled to a second input of the NOR gate 409. The output signal PISTAT$_{13}$H from the NOR gate 409, which is the filtered output signal of the glitch filter 400, is also applied to a second input of the NOR gate 407.

Figure 5:
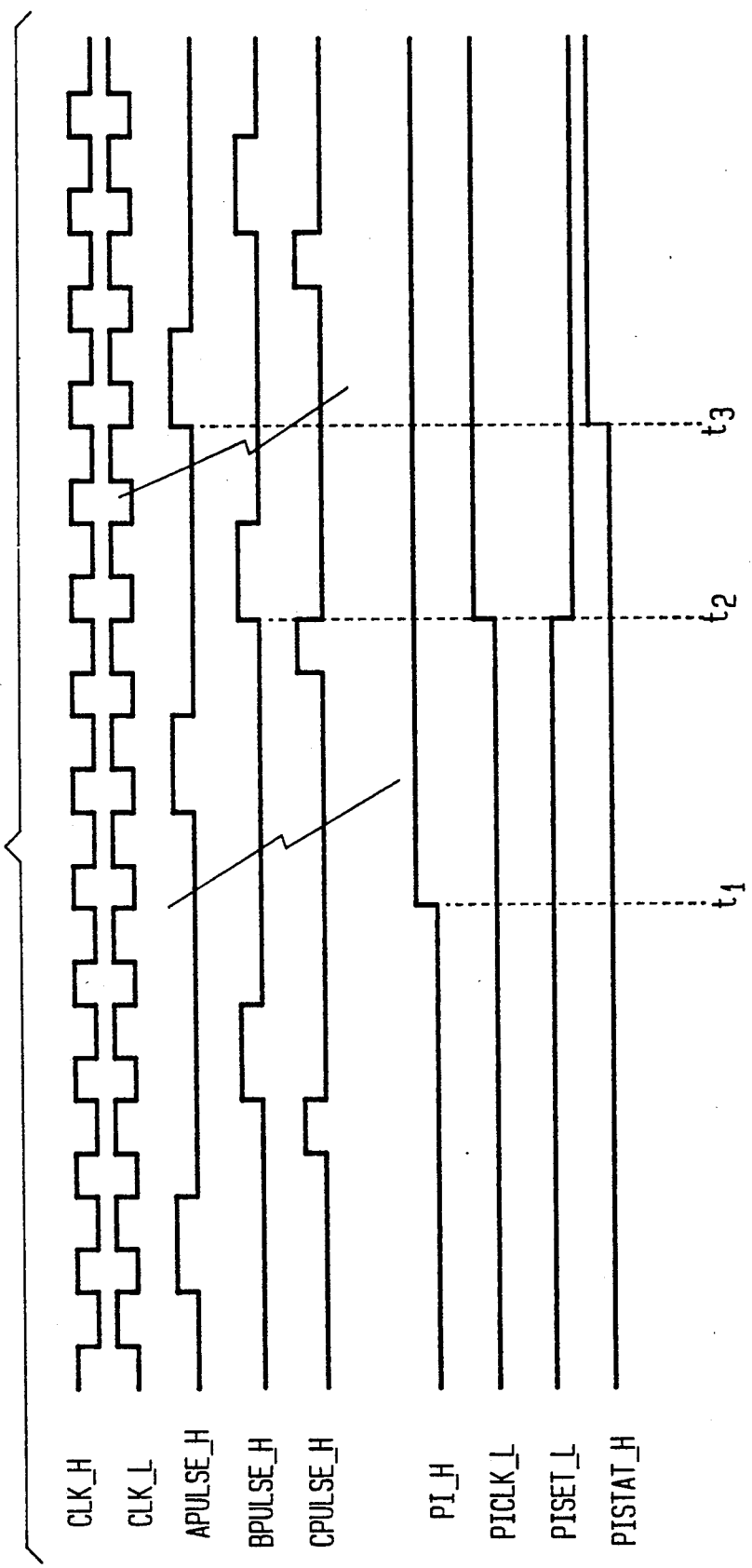
FIG. 5 shows a timing diagram for the glitch filter of FIG. 4 for the case in which the input signal is such that the glitch filter changes the state of the output signal.

Referring to FIG. 5, there is shown a timing diagram for the glitch filter of FIG. 4 for the case in which the input signal PI$_{13}$H is such that the glitch filter changes the state of the output signal PISTAT$_{13}$H (in particular, it changes from a LOW state to a HIGH state).

Signal PISET$_{13}$L is initialized by reset circuitry (not shown) to a HIGH state. Signal PICLR$_{13}$L is initialized to a LOW state. Output signal PISTAT$_{13}$H is also initialized to a LOW state.

As shown in FIG. 5, the input signal PI$_{13}$H goes from a LOW state to a HIGH state at time $t_1$. Thereafter, at time $t_2$, the sampling pulse BPULSE$_{13}$H supplied by the clock pulse generator goes to a HIGH state, causing PISET$_{13}$L to go to a LOW state and PICLR$_{13}$L to go to a HIGH state (through the operation of gates 401–403). Because the input signal PI$_{13}$H is still in a HIGH state when the sampling pulse APULSE$_{13}$H supplied by the clock pulse generator goes to a HIGH state, at time $t_3$, the output signal PISTAT$_{13}$H goes to a HIGH state (through the operation of gates 404–409).

Figure 6:
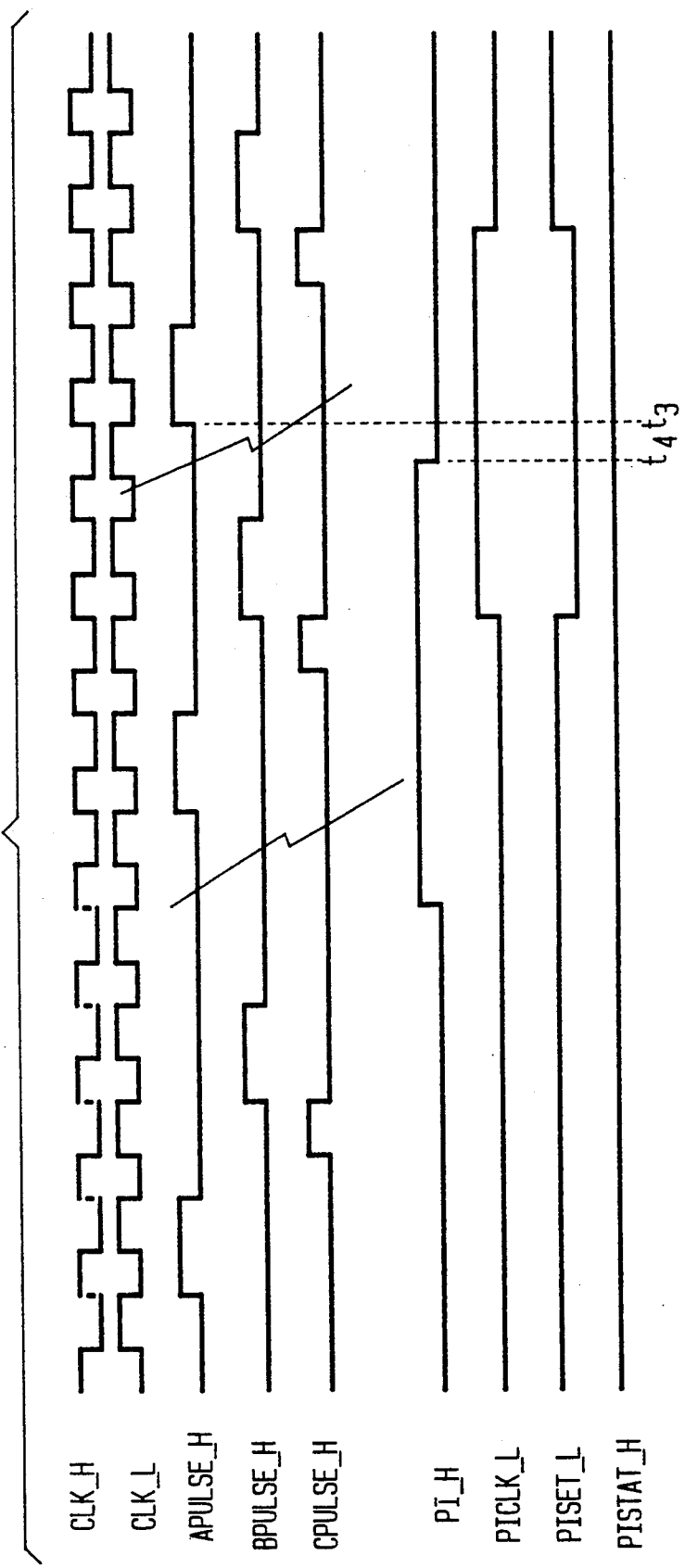
FIG. 6 shows a timing diagram for the glitch filter of FIG. 4 for the case in which the input signal is such that the glitch filter does not change the state of the output signal.

Referring to FIG. 6, there is shown a timing diagram for the glitch filter of FIG. 4 for the case in which the input signal PI$_{13}$H is such that the glitch filter does not change the state of the output signal PISTAT$_{13}$H (in particular, it remains in a LOW state). In contrast to FIG. 5, because the input signal PI$_{13}$H goes to a LOW STATE, at time $t_4$, before the sampling pulse APULSE$_{13}$H goes to a HIGH state, at time $t_3$, gates 404–409 do not change the state of the output signal PISTAT$_{13}$H.

Therefore, in order for the output signal PISTAT$_{13}$H to change from a LOW state to a HIGH state, the input signal PI$_{13}$H must change to a HIGH state, and remain in the HIGH state at least from a time when the sampling pulse BPULSE$_{13}$H is in a HIGH state until a later time when the sampling pulse APULSE$_{13}$H is in a HIGH state.

Similarly, in order for the output signal PISTAT$_{13}$H to change from a HIGH state to a LOW state, the input signal PI$_{13}$H must change to a LOW state, and remain in the LOW state at least from a time when the sampling pulse CPULSE$_{13}$H supplied by the clock pulse generator is in a HIGH state until a later time when the sampling pulse APULSE$_{13}$H is in a HIGH state.

Each of these time periods corresponds approximately to the time between consecutive rising edges of the sampling clock signal PICLK$_{13}$H (as shown in FIG. 3). Therefore, the sampling clock signal PICLK$_{13}$H determines generally the minimum amount of time in which the input signal PI$_{13}$H must be in a changed state in order to change the state of the output signal PISTAT$_{13}$H.

The clock pulse generator of FIG. 2 requires 64 gates, when implemented in TSB140G technology, to generate the sampling pulses APULSE$_{13}$H, APULSE$_{13}$L, BPULSE$_{13}$H, CPULSE$_{13}$H needed for the glitch filter of FIG. 4. This generator, however, can be used for all of the glitch filters in a computer system, and therefore is a one-time overhead. The glitch filter of FIG. 4 requires only 9 gates, as compared to 19 gates for the glitch filter of the prior art shown in FIG. 1 when using TSB140G technology.

Therefore, when more than six glitch filters are needed in a computer system, using the glitch filters and clock pulse generator according to the present invention requires fewer gates that using the glitch filters of the prior art. As the number of glitch filters needed increases further, the savings in the total number of gates required becomes significantly larger. For example, if 80 glitch filters are needed, using glitch filters of the prior art would require 1520 gates, while using glitch filters according to the present invention would require only 784 gates—a savings of 736 gates. As a result, for multiple-signal applications, the glitch filter according to the present invention may also have smaller die size and lower costs.

What is claimed is:
1. A glitch filter comprising:
  a first AND gate for receiving both a signal to be filtered and a second pulse signal;
  a first NOR gate having a first input coupled to an output of the first AND gate;

a second NOR gate having a first input coupled to an output of the first NOR gate, a second input for receiving a third pulse signal, and an output coupled to a second input of the first NOR gate;

a third NOR gate having a first input coupled to the output of the first NOR gate;

a fourth NOR gate having a first input for receiving the signal to be filtered, and a second input coupled to the output of the second NOR gate;

a second AND gate having a first input for receiving the signal to be filtered, and a second input coupled to an output of the third NOR gate;

a fifth NOR gate having a first input coupled to an output of the second AND gate;

a third AND gate having a first input coupled to an output of the fourth NOR gate and a second input for receiving a first pulse signal, the third NOR gate having a second input for receiving an inverted first pulse signal;

a sixth NOR gate having a first input coupled an output of the third AND gate, a second input coupled to an output of the fifth NOR gate, and an output coupled to a second input of the fifth NOR gate, the output of the sixth NOR gate being a filtered output signal of the glitch filter;

wherein each of the first, second and third pulse signals is in a HIGH state for a preselected portion of the period of the pulse signal.

2. The glitch filter as recited in claim 1, further comprising a clock generator for generating the first pulse signal, the inverted first pulse signal, the second pulse signal, and the third pulse signal as a function of a system clock signal.

3. The glitch filter as recited in claim 2, wherein the clock generator includes first through sixth D flip-flops, a D input of the first D flip-flop receiving a sampling clock signal based on the system clock signal, a D input of the second through sixth D flip-flops coupled to a Q output of the first through fifth D flip-flops, respectively.

4. The glitch filter as recited in claim 3, wherein the clock generator further includes:

a first NAND gate having a first input for receiving the sampling clock signal, and a second input coupled to an inverting-Q output of the second D flip-flop;

a first invertor having an input coupled to an output of the first NAND gate, an output of the first invertor being the first pulse signal; and a second invertor having an input coupled to the output of the first invertor, an output of the second invertor being the inverted first pulse signal.

5. The glitch filter as recited in claim 4, wherein the clock generator further includes:

an second NAND gate having a first input coupled to the Q output of the fourth D flip-flop, and a second input coupled to an inverting-Q output of the sixth D flip-flop; and a third invertor having an input coupled to an output of the second NAND gate, an output of the third invertor being the second pulse signal.

6. The glitch filter as recited in claim 5, wherein the clock generator further includes:

a third NAND gate having a first input coupled to the Q output of the third D flip-flop, and a second input coupled to an inverting-Q output of the fourth D flip-flop; and a fourth invertor having an input coupled to an output of the third NAND gate, an output of the fourth invertor being the third pulse signal.

7. The glitch filter as recited in claim 6, wherein each of the D flip-flops has a clear input for receiving a system clear signal to reset the D flip-flops.

8. The glitch filter as recited in claim 7, wherein each of the D flip-flops has a clock input for receiving the system clock signal.

9. The glitch filter as recited in claim 1, wherein the filtered output signal of the glitch filter changes from a LOW state to a HIGH state only if the signal to be filtered changes from the LOW state to the HIGH state and remains in the HIGH state at least from a first time when the second pulse signal is in the HIGH state until a second time when the first pulse signal is in the HIGH state.

10. The glitch filter as recited in claim 1, wherein the filtered output signal of the glitch filter changes from a HIGH state to a LOW state only if the signal to be filtered changes from the HIGH state to the LOW state and remains in the LOW state at least from a third time when the third pulse signal is in the HIGH state until a fourth time when the first pulse signal is in the HIGH state.

* * * * *